United States Patent [19]
Burns et al.

[11] Patent Number: 5,505,320
[45] Date of Patent: Apr. 9, 1996

[54] METHOD EMPLOYING LASER ABLATING FOR PROVIDING A PATTERN ON A SUBSTRATE

[75] Inventors: Francis C. Burns; Robert L. Lewis, both of Apalachin; Steven W. Opie; Robert D. Sebesta, both of Endicott, all of N.Y.

[73] Assignee: International Business Machines Corporation, Armonk, N.Y.

[21] Appl. No.: 343,162

[22] Filed: Nov. 22, 1994

[51] Int. Cl.⁶ .......................... H01B 13/00; B44C 1/22; C23F 1/00
[52] U.S. Cl. .................. 216/13; 216/65; 216/94
[58] Field of Search ................ 216/13, 16, 41, 216/65, 94; 156/643.1, 656.1, 659.11; 219/121.68, 121.69, 121.85

[56] References Cited

U.S. PATENT DOCUMENTS

| | | | |
|---|---|---|---|
| 4,414,059 | 11/1983 | Blum et al. | 156/659.1 |
| 4,490,211 | 12/1984 | Chen et al. | 216/65 X |
| 4,568,632 | 2/1986 | Blum et al. | 430/322 |
| 5,104,480 | 4/1992 | Wojnarowski et al. | 216/65 |
| 5,236,551 | 8/1993 | Pan | 156/643 |

OTHER PUBLICATIONS

Laser Ablation of Thin Chromium Layer, Abstract—Research Disclosure, 1988, No. 292, Kenneth Mason Publications Ltd., England (29267).

*Primary Examiner*—William Powell
*Attorney, Agent, or Firm*—Pollock, Vande Sande & Priddy

[57] ABSTRACT

A pattern is provided on a substrate by providing the substrate with at least two layers of material thereon and providing a layer of dry imaging polymer compositions thereon. The layer of the dry imaging polymer composition is laser ablated to provide the desired personality pattern. The top exposed portion of at least the top layer is removed and the desired select pattern is laser ablated. The exposed portions of said first layer is removed and the pattern is completed through the other layers of material to thereby expose the substrate surface, without the substrate surface being subjected to laser ablating to thereby provide the desired pattern on the substrate.

17 Claims, 2 Drawing Sheets

METHOD EMPLOYING LASER ABLATING FOR PROVIDING A PATTERN ON A SUBSTRATE

DESCRIPTION

1. Technical Field

The present invention is concerned with a method for providing a pattern on a substrate employing laser ablating. The process of the present invention is especially advantageous with respect to substrates that are susceptible to damage by the laser. In particular, the substrate, pursuant to the process of the present invention is protected against damage by the laser, which in turn makes it possible to employ dry or laser imaging with substrates that are susceptible to damage or ablation by the laser.

2. Background Art

The manufacture of integrated circuit electronic packages involves the interconnection between the integrated circuit carrier or substrate and the integrated semiconductor device or chip. Many commercial integrated circuit carriers or substrates are fabricated by applying to a substrate, such as a ceramic, or a polymeric material, a chrome-layer, followed by a copper layer, followed by another chrome layer.

In particular, in the production of the metal circuit lines on the substrate, two metal etching steps are typically needed in order to define the metal circuit pattern. Usually, the substrate is blanket coated with the metal, such as the chromium-copper-chromium sandwich. A photoresist is then applied to the metal. The photoresist is baked, exposed and developed to establish the basic circuit pattern in the photoresist. Next, the chromium-copper-chromium metal is wet etched, which creates the circuit pattern in the metal. This is referred to as the personality etching. The remaining photoresist is then removed by chemical stripping, and a second coating of photoresist is then applied. The second coating of photoresist is then exposed, developed and baked to open areas on the metal circuit pattern from which the top chromium is to be etched. The top chromium is then selectively wet etched to reveal the underlying copper surface. The remaining photoresist is removed by chemical stripping. This is referred to as the select etching.

Recently, it has been suggested to employ dry etching as an alternative to the wet photolithography discussed above. In such a procedure, the substrate is blanket coated with the chromium-copper-chromium sandwich and the metal is coated with a polymer composition. The personality circuit pattern is then provided by subjecting the polymer composition to laser ablation. The unprotected or exposed chromium-copper-chromium is then removed by wet etching. Next, the select pattern is provided by laser ablating the polymer composition in those areas where the top chromium layer is to be etched. The top chromium layer is then wet etched. The remaining polymer is removed or permitted to remain as a protective barrier against contamination and mechanical damage.

However, dry imaging for the select etching step is restricted to those substrates, such as ceramics that are not effected by the excimer laser light employed. In defining the selected pattern by irradiating with laser light, some portion of the underlying substrate will necessarily be exposed to the laser light. However, for a substrate such as ceramic, the intensity of the laser light is typically low enough so as not to cause damage to the substrate. On the other hand, for a polymeric substrate, such as a polyimide or fluorocarbon polymer, exposure to the laser light would result in a significant etching and therefore damage to the substrate. Because of this potential damage to such a substrate, dry imaging cannot be used for defining the select etching area when the substrate is laser ablatable, such as when the substrate is a polymeric composition, such as a polyimide or fluorocarbon polymer.

SUMMARY OF INVENTION

The process of the present invention employs dry imaging for both the personality and select features of the circuit pattern. The present invention is especially advantageous for substrates that are laser ablatable or susceptible to significant damage by the laser employed. In particular, the process of the present invention provides for protecting the substrate during the select patterning processing.

In particular, the present invention is concerned with a method for providing a pattern on a substrate which comprises providing a substrate with a plurality of layers comprising at least a first layer of a first material adjacent at least one major surface of the substrate, and a second layer of a second material adjacent the first layer. The second layer of material is of a material that is different than the material of the first layer. These at least two layers are of materials that are capable of blocking the laser from contacting layers beneath them.

A layer of a dry imaging polymeric composition is provided on top of the second layer. The layer of the dry imaging polymeric composition is subjected to laser ablating to thereby provide the desired personality pattern. The portion of the top or uppermost layer of the plurality of layers that has been exposed by the laser ablating is then removed while leaving the first layer.

The desired select pattern is provided by laser ablating the layer of the dry imaging polymeric composition. The exposed portions of the first layer as well as those remaining exposed portions of the other layer(s) are removed to expose the substrate surface, without the substrate being subjected to the laser ablating to thereby provide the desired pattern on the substrate.

The bottom or first layer protects the substrate, if necessary, from damage by the laser ablating employed to provide the select pattern.

BEST AND VARIOUS MODES FOR CARRYING OUT INVENTION

Figure 1:
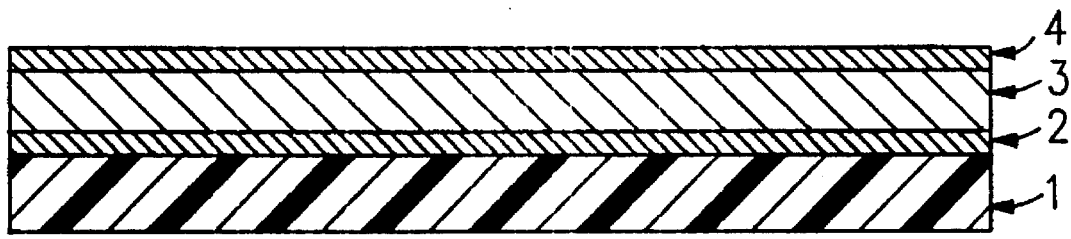
FIGS. 1 through 6 are schematic drawings, illustrating the integrated circuit substrate during various stages of the processing.

In order to facilitate an understanding of the present invention, reference will be made to the figures. In FIG. 1, the numeral 1 represents the substrate which is preferably laser ablatable or susceptible to laser damage in order to take advantage of all of the benefits of the process of the present invention. Examples of such substrates include polyimides and fluorocarbon polymers, such as poly(tetrafluoroethylene), and various polyepoxides.

The polyimides used in accordance with the present invention include unmodified polyimides, as well as modified polyimides, such as polyesterimides, polyamide-imide-esters, polyamide-imides, polysiloxane imides, as well as other mixed polyimides. Such are well known in the prior art and need not be described in any great detail.

Commercially available polyimide precursors (polyamic acid) are various polyimide precursors from Dupont and available under the trade designation Pyralin. These polyimide precursors come in many grades, including those available Pyralin and polyimide precursors from Dupont under the further trade designations PI-2555 PI-2545, PI-2560, PI-5878, PIH-61454, and PI-2540. Some of these are pyromelletic dianhydride-oxydianiline (PMDA-ODA) polyimide precursors.

Commercially available chemically cured polyimides are various polyimides from Dupont and available under the trade designation Kapton, including H-Kapton, V-Kapton, HN-Kapton and VN-Capton, which are all chemically cured polyimides. The chemically cured polyimides are generally cured with an anhydride curing agent, such as acetic anhydride.

In the alternative, the present invention can be employed with those substrates that are resistant to laser ablation, such as the ceramic substrates. The ceramics are also well-known and need not be described in any great detail, and include such materials as aluminum oxides, silicon oxides, silicates such as aluminum silicate, and mixtures of these materials.

Located on at least one major surface of substrate 1 is provided a first layer of a first material (2). The first material is preferably an electrically conductive metal and most preferably is chromium. The first layer is typically about 5000 to about 7000 angstroms, preferably about 6000 angstroms. Adjacent first layer (2), according to preferred embodiments, is layer (3) of a second material that differs from the first material. The second material is preferably an electrically conductive metal and most preferably is copper. The layer (3) is typically about 65,000 to about 95,000 angstroms, and preferably about 80,000 angstroms.

Pursuant to the most preferred aspects of the invention, a second layer (4) of the same material in layer (2) is provided atop the layer (3). Typically, the second layer is about 800 to about 1300 angstroms thick, preferably about 1000 angstroms thick, and functions as a solder dam during subsequent processing. The base Cr layer promotes copper to substrate adhesion and also functions as an attenuator of laser energy, in the preferred aspects of the invention.

The layers (2), (3) and (4) can be blanket coated onto the substrate by any of the techniques known in the prior art.

Figure 2:
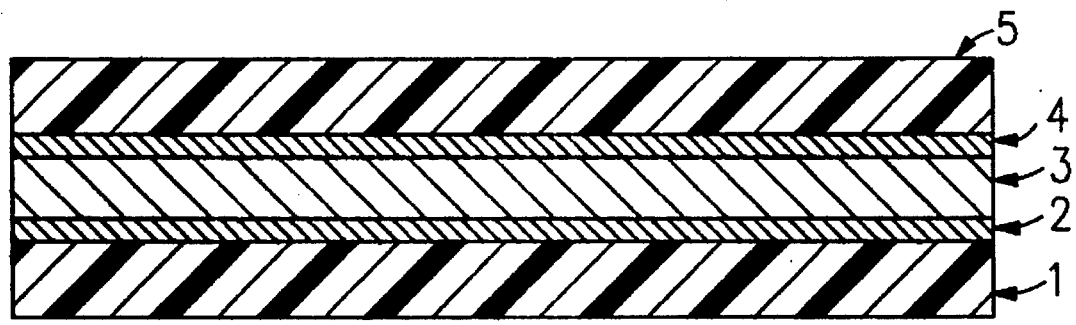

Next, as illustrated in FIG. 2, a layer of a dry imaging polymeric composition (5) is blanket coated on top of the second layer (4). A typical composition is a polyimide composition of the type referred to hereinabove employed for the substrate. Typically, the polyimide layer is about 50,000 to about 200,000 angstroms thick, preferably about 80,000 angstroms thick.

Figure 3:
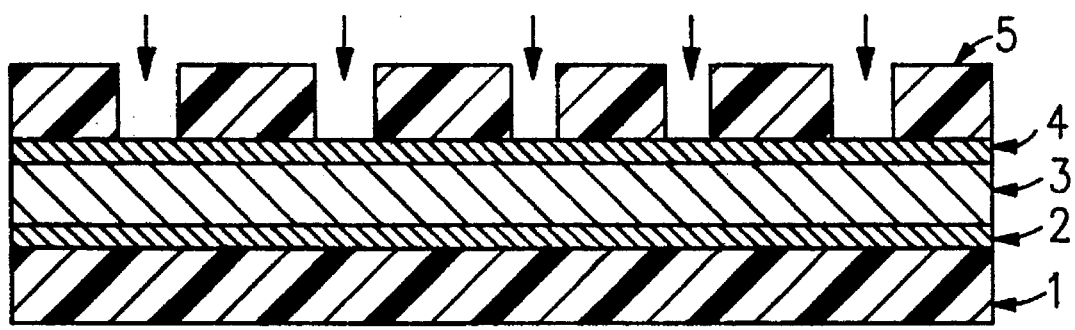

Next, as illustrated in FIG. 3, layer 5 is subjected to laser ablating to thereby provide the desired personality pattern. Any of the known technique for laser ablating can be employed. For instance, in the case of polyimides, the film is subjected to UV radiation of 308 nanometer wavelength. A commercially available source for such is the xenon chloride excimer laser.

The xenon chloride excimer laser as is well known, is designed for pulsed operation and, typically 200 mJ pulses/ $cm^2$ are available at a repetition rate of about 300/second. This laser can be coupled to appropriate beam shaping and homogenizing optics to provide an apparatus for projecting a coherent beam through a mask. In general, intensities above about 60 mJ/$cm^2$ are employed for the laser ablating. Further detail of laser ablating of polyimides can be found for example, in U.S. Pat. No. 4,568,632, disclosure of which is incorporated herein by reference.

Figure 4:
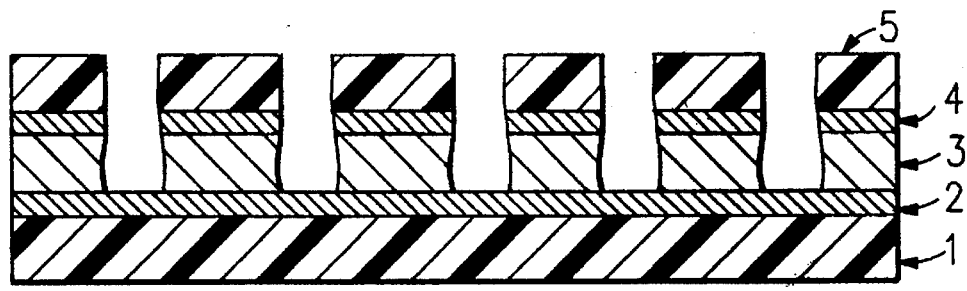

Next, as illustrated by FIG. 4, the exposed portions of the layer (4) are removed. One such removal method employs a wet etching process. Well known etching compositions, such as a potassium permangenate and sodium hydroxide solution, can be employed for etching this layer when it is chromium. If desired, the structure can then be subjected to a rinse with, for instance, deionized water prior to subsequent processing.

The portion of layer (3) that is now exposed after removal of the layer (4) can also be etched employing wet chemistry at this stage of the process, or can be etched subsequent to the select laser ablating procedure to be carried out and discussed hereinbelow. A typical example of a copper etchant is a ferric chloride composition. Upon removal of these exposed portions of the layer (3) and (4), the various parts of the circuitry, such as the wiring and pads are created. After etching of the layer (3), if desired, the structure can then be subjected to a rinse with, for instance, deionized water prior to subsequent processing.

Figure 5:
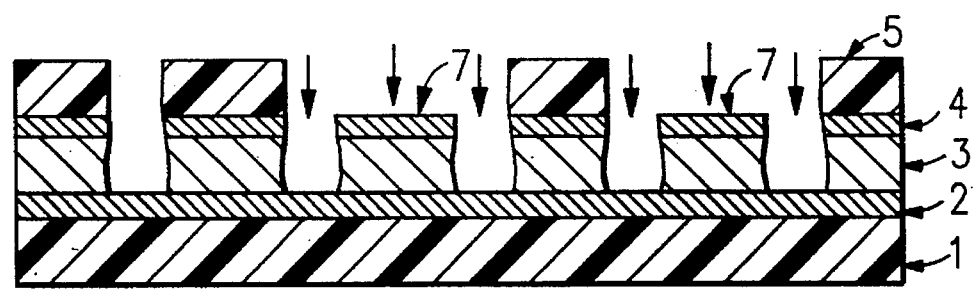
Figure 6:
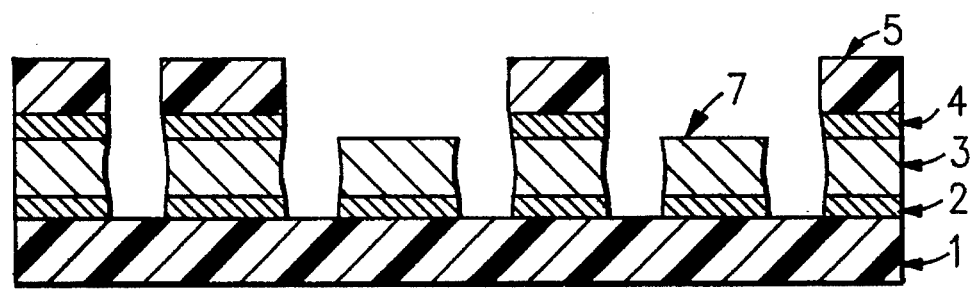

As illustrated in FIG. 5, portions of the layer (5) of the dry imaging polymeric composition are subjected to laser ablating to provide the desired select pattern, resulting in exposure of the layer (4), such as chromium, on the connection sites illustrated by 7. The select laser process employed can be the same as that process used for providing the personality pattern as discussed hereinabove. The first layer (2) of, for instance chromium, protects the substrate during this laser ablating procedure. In addition, if the exposed portions of the layer (3), such as copper, have not already been removed, as discussed above, such will be removed at this stage of the process employing the same wet etching procedures as discussed hereinabove. Moreover, if the layer (3), such as copper, is not removed prior to the select laser ablating step, such will also, in conjunction with the layer (2), provide protection to the underlying substrate during the ablating process.

In any event, during the removal of the layer (3), the layer (4) of, for example chromium, will act as an etch mask for the layer (3).

Next, the remaining exposed portions of the layer (4), along with the exposed portions of the first layer (2) are removed by the same procedure, such as a wet etching step of the type discussed hereinabove, since preferably these are the same material. The removal of the exposed portions of the layer (4) of, for instance chromium, removes such from the connection sites.

According to preferred aspects of the present invention, as illustrated by the above sequence, the process reduces the total number of chromium removal steps from 3 as previously deemed necessary to 2.

What is claimed is:

1. A method for providing a pattern on a substrate which comprises:

a) providing a substrate with a plurality of layers comprising at least a first layer of a first material adjacent at least one major surface of said substrate, and a second layer of material adjacent said first layer wherein said second layer is of material different from the material of said first layer;

b) providing a layer of a dry imaging polymeric composition on top of said second layer;

c) laser ablating said layer of a dry imaging polymeric composition to provide a desired personality pattern;

d) removing the exposed portion of an uppermost layer of said plurality of layers while leaving said first layer;

e) laser ablating portion of said layer of a dry imaging polymeric composition remaining after step c), to provide a desired select pattern;

f) removing the exposed portions of said first layer and completing the pattern through the plurality of layers to thereby expose the substrate surface, without the substrate surface being subjected to said laser ablating to thereby provide the desired pattern on said substrate.

2. The method of claim 1 wherein said substrate is laser ablatable.

3. The method of claim 1 wherein said substrate is a polyimide.

4. The method of claim 1 wherein said substrate is a fluorocarbon polymer.

5. The method of claim 1 wherein said step a) comprises providing a substrate with a first layer of chromium adjacent at least one major surface of said substrate, a layer of copper adjacent said first layer of chromium and a second layer of chromium adjacent said layer of copper.

6. The method of claim 5 wherein said second layer of chromium is removed in step d).

7. The method of claim 5 wherein said second layer of chromium and said layer of copper are removed in step d).

8. The method of claim 5 wherein the thickness of the first layer of chromium and copper layer is sufficient to protect the substrate during the laser ablating step e).

9. The method of claim 8 wherein the thickness of the first layer of chromium alone is sufficient to protect the substrate from the laser ablating step e).

10. The method of claim 5 wherein said first layer of chromium is about 5000 to about 7000 angstroms thick.

11. The method of claim 5 wherein said layer of copper is about 65,000 to about 95,000 angstroms thick.

12. The method of claim 5 wherein said second layer of chromium is about 800 to about 1,300 angstroms thick.

13. The method of claim 1 wherein said layer of a dry imaging polymeric composition is a polyimide composition.

14. The method of claim 1 wherein said layer of a dry imaging polymeric composition is about 50,000 to about 200,000 angstroms thick.

15. The method of claim 1 wherein the laser ablating steps employ far UV radiation of about 308 nanometers.

16. The method of claim 1 wherein the laser ablating steps employ a xenon halide excimer laser.

17. The method of claim 1 wherein said first layer and said second layer are removed employing wet etching.

* * * * *